(12) United States Patent
Nguyen et al.

(10) Patent No.: US 6,490,212 B1
(45) Date of Patent: Dec. 3, 2002

(54) BITLINE PRECHARGE MATCHING

(75) Inventors: Hung Q. Nguyen, Fremont, CA (US); Nianglamching Hangzo, San Jose, CA (US); Sang Thanh Nguyen, Union City, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/904,160

(22) Filed: Jul. 11, 2001

(51) Int. Cl.$^7$ .................................................. G11C 7/00
(52) U.S. Cl. .................. 365/207; 365/189.07; 365/194; 365/210
(58) Field of Search ........................... 365/207, 189.07, 365/210, 194, 203, 233.5

(56) References Cited

U.S. PATENT DOCUMENTS

| | | | | |
|---|---|---|---|---|
| 5,241,505 A | * | 8/1993 | Hashimoto | 365/210 |
| 5,363,340 A | * | 11/1994 | Ishikawa | 365/233.5 |
| 5,386,158 A | * | 1/1995 | Wang | 365/189.07 |
| 5,539,694 A | * | 7/1996 | Rouy | 365/189.07 |
| 5,629,892 A | * | 5/1997 | Tang | 365/185.2 |
| 6,075,738 A | * | 6/2000 | Takano | 365/210 |

* cited by examiner

*Primary Examiner*—Tan T. Nguyen
(74) *Attorney, Agent, or Firm*—Gray Cary Ware & Friedenrich LLP

(57) ABSTRACT

A memory device includes a sense circuit comprising a sense amplifier, a reference sense circuit and a comparator. The sense amplifier detects a signal on a bit line associated with a column of memory cells in a memory array. The reference sense circuit detects a signal on a reference bit line associated with a column of reference cells in the memory array. The comparator compares the outputs of the sense amplifier and the reference sense circuit and provides a signal indicative of the contents of the read memory cell. In response to a transition of an address, the bit line and the reference bit line are precharged prior to reading of the memory cell. The reference sense circuit includes a selectable load that is disabled during the initial time after the address transition so that the bit line and the reference bit line rises substantially identically and then enabled to allow the reference bit line to settle to a steady state.

25 Claims, 3 Drawing Sheets

BITLINE PRECHARGE MATCHING

BACKGROUND OF THE INVENTION

The present invention relates to memory devices, and more particularly relates to differential sensing of memory cells.

Flash memory devices include a memory array of memory cells arranged in rows and columns. A reference column of reference memory cells generates reference voltages for comparing to data stored in columns of memory cells. A sense circuit includes a plurality of sense amplifiers, a plurality of reference sense amplifiers, and a plurality of comparators. One of the sense amplifiers is coupled to a corresponding bit line that is coupled to a column of memory cells. Each of the reference sense amplifiers is coupled to a reference bit line that is coupled to the reference column of reference memory cells. One of the comparators is coupled to a corresponding sense amplifier and a corresponding reference sense amplifier for generating a signal indicative of the content of the read memory cell. The output of the comparator is latched and buffered. Before reading the memory cell, the bit line and the reference bit line are precharged. Before the data can be read and latched, the precharge voltage on the bit line and the reference bit line must settle.

SUMMARY OF THE INVENTION

The present invention provides a sense amplifier circuit that comprises a sense amplifier, a reference sense circuit and a comparator. The sense amplifier provides a sense signal in response to a voltage level on a bit line. The reference sense circuit provides a reference sense signal in response to a voltage on a reference column line. The reference sense circuit provides variable loading on the reference column line in response to a delay signal. The comparator provides a signal indicative of the signal on the bit line in response to the sense signal and the reference sense signal.

In one aspect of the invention, the delay signal is applied in response to a detected address transition. The delay signal may have a pulse width sufficient to allow precharge signals applied to the bit line and the reference bit line to achieve a near steady state condition.

In another aspect of the present invention, a memory circuit comprises an array of memory cells arranged in rows and columns and including a column of reference cells, a plurality of bit lines, and a reference bit line. Each of the plurality of bit lines connects a corresponding column of memory cells. The reference bit line connects the column of reference cells. A decoder is coupled to the rows of memory cells for selecting a row of memory cells and a corresponding reference cell in response to an address signal. An address detection circuit provides an address detection signal and a delay signal in response to a change of the address signal. A precharge circuit is coupled to the address detection circuit and the memory array for precharging the plurality of bit lines and the reference bit line in response to the address detection signal. A sense amplifier circuit comprises a sense amplifier, a reference sense circuit and a comparator. The sense amplifier provides a sense signal in response to a voltage level on a bit line. The reference sense circuit provides a reference sense signal in response to a voltage on a reference column line. The reference sense circuit provides variable loading on the reference column line in response to a delay signal. The comparator provides a signal indicative of the signal on the bit line in response to the sense signal and the reference sense signal.

DETAILED DESCRIPTION

Figure 1:
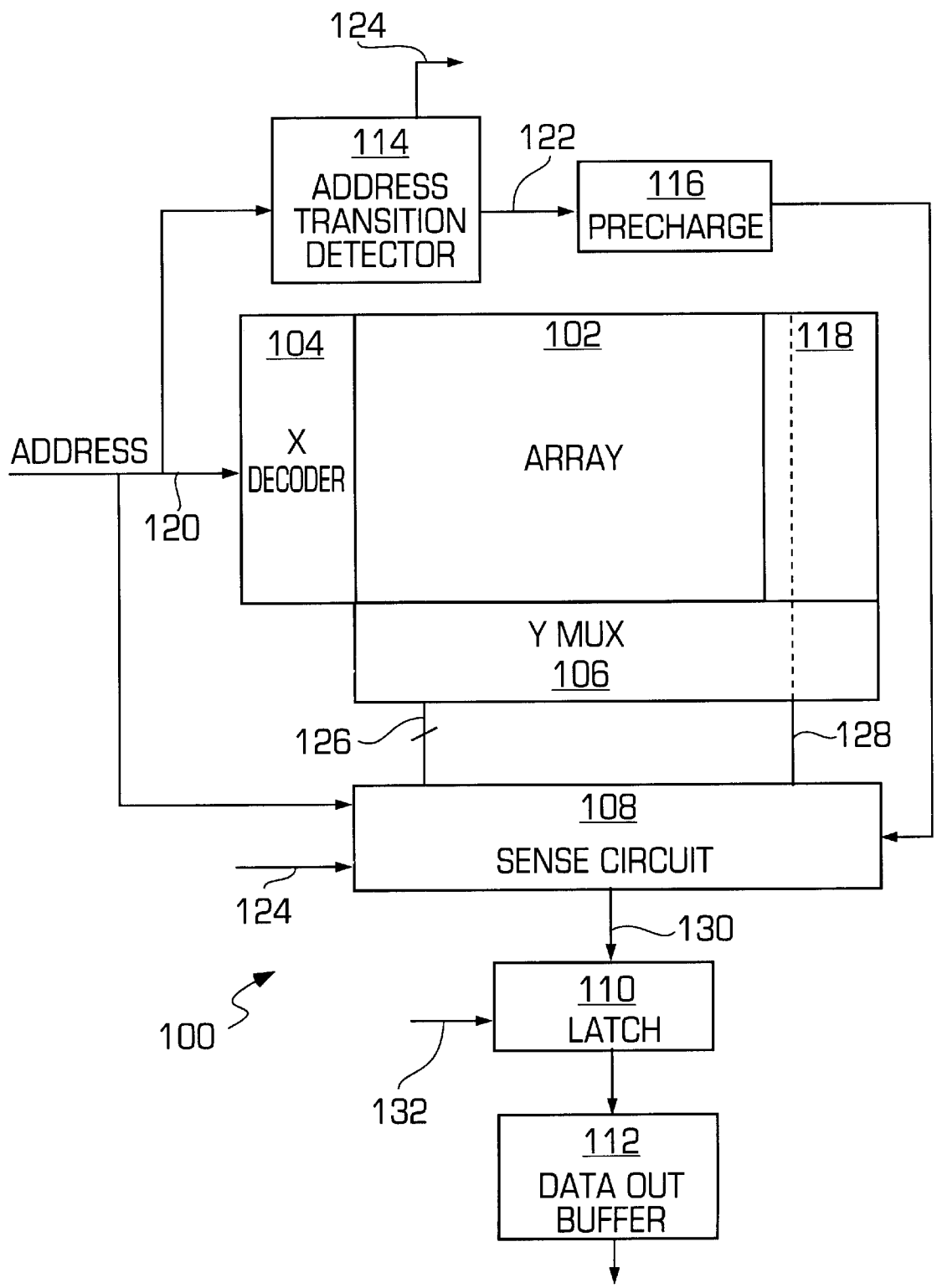
FIG. 1 is a block diagram of a memory circuit in accordance with the present invention.

FIG. 1 is a block diagram of a memory circuit 100 in accordance with the present invention. The memory circuit 100 includes an array 102, X-decoders 104, a Y-multiplexer 106, a sense circuit 108, a latch 110, a data output buffer 112, an address transition detector 114, and a precharge circuit 116. The array 102 includes memory cells (not shown) arranged in rows and columns in a well-known manner. The array 102 includes a reference column 118. As is well known in the art, the X-decoders 104 decode an address signal 120 for selecting a word line of both memory cells (not shown) of the array 102 and a corresponding reference cell (not shown) of the reference column 118. In addition, the address transition detector 114 provides an address transition signal 122 to the precharge circuit 116 for precharging bitlines (not shown) that interconnect memory cells in columns of the array 102. The address transition signal 122 is generated in response to a chip enable signal or a change of the address signal 120. The address transition detector 114 also generates a delayed address transition signal 124. The bit lines of the columns of memory cells of the array 102 are coupled to the Y-multiplexer 106, and the bit line corresponding to the reference column 118 is also coupled to the Y-multiplexer 106. The Y-multiplexer 106 provides signals read from the bitlines of the column and reference column to a bit line 126 and a bit reference line 128, respectively. The sense circuit 108 compares the signals on the bit line 126 and the bit reference line 128 to corresponding compare the read cell and the reference cell, and provides a signal indicative of the content of the memory cell to the latch 110. The latch 110 latches the signal on an output terminal 130 of the sense circuit 108 in response to a latch signal 132. The latch signal 132 is provided to the data output buffer 112 which in turn provides the read data.

The sense circuit 108 may be a sense circuit 400 described below in conjunction with FIG. 4. In a memory circuit 100 having reduced capability, the sense circuit 108 may be a conventional sense circuit 200 as described below in conjunction with FIG. 2 by not using the delayed address transition signal 124. The sense circuit 400 in accordance with the present invention provides advantages over the conventional sense circuit 200 as described below.

Figure 2:
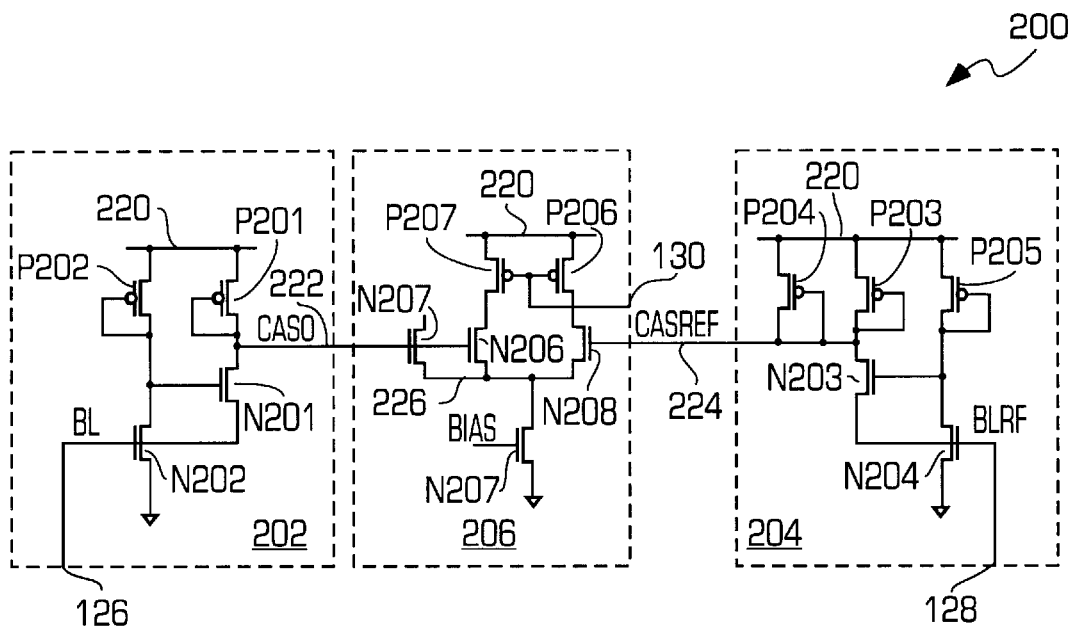
FIG. 2 is a schematic diagram illustrating a conventional sense circuit useable in a memory circuit.

FIG. 2 is a schematic diagram illustrating a conventional sense circuit 200, which comprises a sense amplifier 202, a reference sense circuit 204, and a comparator 206. For clarity, the sense amplifier 202, the reference sense circuit 204, and the comparator 206 for only one bit line and column is shown.

The sense amplifier 202 comprises n-channel metal oxide semiconductor field effect transistors (NMOS transistors)

N201, N202 and p-channel metal oxide semiconductor field effect transistors (PMOS transistors) P201, P202. The PMOS transistor P201 and the NMOS transistor N201 are coupled in a cascode arrangement. The PMOS transistor P201 includes drain-source terminals coupled between a power supply terminal 220 and a cascode (CASO) node 222, and includes a gate coupled to the cascode node 222. The NMOS transistor N201 includes drain-source terminals coupled between the cascode node 222 and the bitline input 126. The PMOS transistor P202 includes a drain-source terminals coupled between the power supply terminal 220 and the gate of the NMOS transistor N201, and includes a gate coupled to the gate of the NMOS transistor N201. The NMOS transistor N202 includes drain-source terminals coupled between the gate of the PMOS transistor P202 and ground, and includes a gate coupled to the bitline input 126.

The reference sense circuit 204 comprises NMOS transistors N203, N204 and PMOS transistors P203, P204, P205. The PMOS transistor P203 and the NMOS transistor N203 are coupled in a cascode arrangement. The PMOS transistor P203 includes drain-source terminals coupled between the power signal line 220 and a reference cascode (CASREF) node 224, and includes a gate coupled to the reference cascode node 224. The NMOS transistor N203 includes drain-source terminals coupled between the reference cascode node 224 and the reference bitline (BLRF) node 128. The PMOS transistor P204 includes drain-source terminals coupled between the power signal line 220 and the reference cascode node 224, and includes a gate coupled to the reference cascode node 224. The PMOS transistor P205 includes drain-source terminals coupled between the power signal line 220 and the gate of the NMOS transistor N203, and includes a gate coupled to the gate of the NMOS transistor N203. The NMOS transistor N204 includes drain-source terminals coupled between the gate of the PMOS transistor P205 and ground, and includes a gate coupled to the reference bitline (BLRF) node 128. The capacitance of the bit line 126 and the reference bit 128 are substantially equal, but the voltage on the reference bit line 128 is a voltage between the typical voltages on the bit line 126 corresponding to the logic levels of the memory cells. The PMOS transistor P204 provides additional pull up to compensate for the different voltage level.

The comparator 206 comprises NMOS transistors N205, N206, N207, N208 and PMOS transistors P206, P207. The comparator 206 is arranged as a differential amplifier. The PMOS transistor P206 includes a drain terminal coupled to the power signal line 220, includes a source terminal coupled to the output terminal 130, and includes a gate coupled to the source terminal of the PMOS transistor P206. The NMOS transistor N205 includes drain-source terminals coupled between the common node formed of the gate and source terminal of the PMOS transistor P206 and a bias node 226, and includes a gate coupled to the reference cascode node 224. The PMOS transistor P207 includes a drain terminal coupled to the power signal line 220, and includes a gate coupled to the gate of the PMOS transistor P206. The NMOS transistor N206 includes drain-source terminals coupled between a source of the PMOS transistor P207 and the bias node 226, and includes a gate coupled to the cascode node 222. The NMOS transistor N207 includes drain-source terminals coupled between the bias node 226 and ground, and includes a gate coupled to receive a bias signal 228. The NMOS transistor N208 includes drain-source terminals coupled between the power signal line 220 and the bias node 226, and includes a gate coupled to the cascode node 222. The NMOS transistor N208 provides additional loading in the comparator 206 to compensate for the loading of the PMOS transistor P204 in the reference sense circuit 204.

Figure 3:
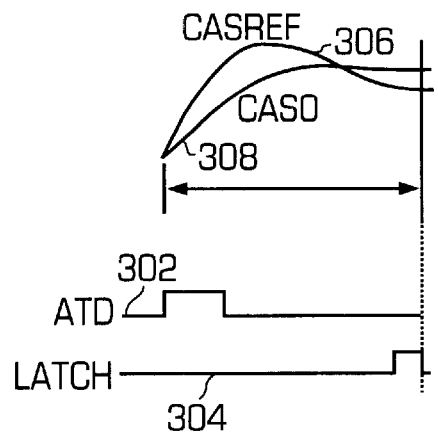
FIG. 3 is a timing diagram illustrating the timing waveforms of the conventional sense circuit of FIG. 2.

FIG. 3 is a timing diagram illustrating the timing waveforms of the conventional bitline precharging circuit 200 of FIG. 2. Line 302 represents the timing of the address transition detection signal 122 from the address transition detector 114 that indicates a transition of an address. At this time the bit line 126 and the reference bit line 128 are precharged. After these lines are precharged, the data is read from the corresponding memory cell and then latched into the latch 110 by the latch signal 132. Line 304 representing the timing of the latch signal 132. Line 306 represents the timing diagram of the reference cascode (CASREF) node 224. Line 308 represents the timing diagram of the cascode (CASREF) node 222.

After the address transition signal 122 is set, the cascode (CASO) node 222 and the cascode references (CASREF) node 224 are precharged before reading of the corresponding memory cell and reference cell. Because the cascode reference (CASREF) node 224 is pulled up by the two PMOS transistors P203, P204, the cascode reference (CASREF) node 224 has a faster precharge ramp rate than the cascode (CASO) node 222. Consequently, the cascode reference (CASREF) node 224 has a time delay relative to the cascode node (CASO) node 222 before reaching a steady state condition for sensing. The latch signal 132 shown in line 304 latches the data read from the comparator 206 into the latch 110.

Figure 4:
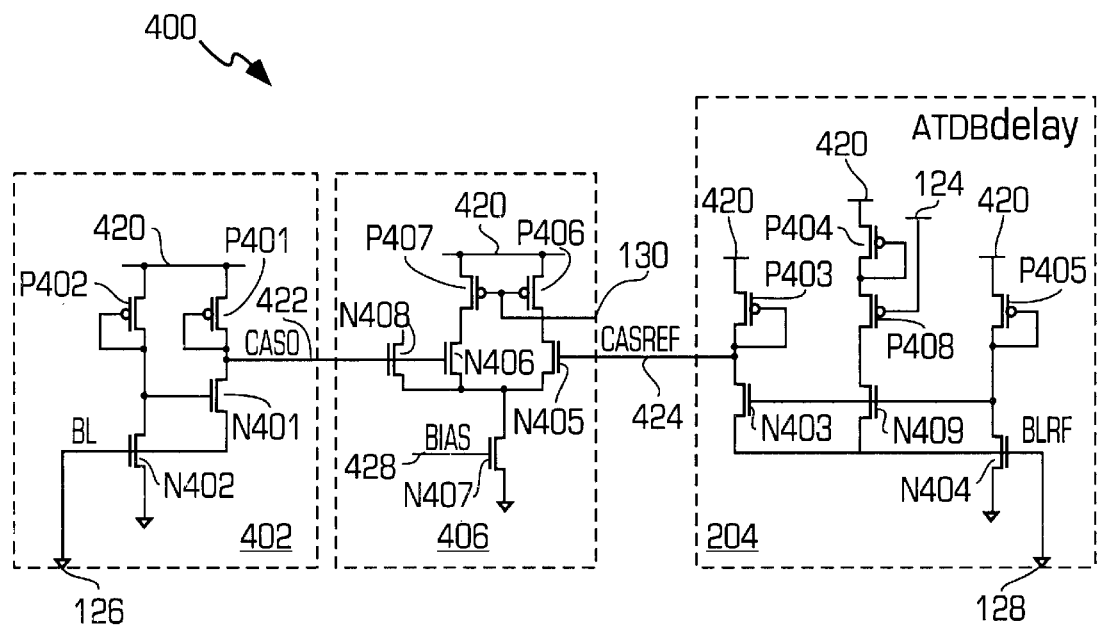
FIG. 4 is a schematic diagram illustrating a sense circuit of the memory circuit of FIG. 1 according to the present invention.

FIG. 4 is a schematic diagram illustrating a bitline precharging circuit 400 according to the present invention. The bitline precharging circuit 400 comprises a sense amplifier 402, a reference sense circuit 404, and a comparator 406. For clarity, the sense amplifier 402, the reference sense circuit 404, and the comparator 406 for only one bit line and column is shown.

The sense amplifier 402 comprises n-channel metal oxide semiconductor field effect transistors (NMOS transistors) N401, N402 and p-channel metal oxide semiconductor field effect transistors (PMOS transistors) P401, P402. The PMOS transistor P401 and the NMOS transistor N401 are coupled in a cascode arrangement. The PMOS transistor P401 includes drain-source terminals coupled between a power supply terminal 420 and a cascode (CASO) node 422, and includes a gate coupled to the cascode node 422. The NMOS transistor N401 includes drain-source terminals coupled between the cascode node 422 and the bitline input 126. The PMOS transistor P402 includes drain-source terminals coupled between the power supply terminal 420 and the gate of the NMOS transistor N401, and includes a gate coupled to the gate of the NMOS transistor N401. The NMOS transistor N402 includes drain-source terminals coupled between the gate of the PMOS transistor P402 and ground, and includes a gate coupled to the bitline input 126.

The reference sense circuit 404 comprises NMOS transistors N403, N404, N409 and PMOS transistors P403, P404, P405, P408. The PMOS transistor P403 and the NMOS transistor N403 are coupled in a cascode arrangement. The PMOS transistor P403 includes drain-source terminals coupled between the power signal line 420 and a reference cascode (CASREF) node 424, and includes a gate coupled to the reference cascode node 424. The NMOS transistor N403 includes drain-source terminals coupled between the reference cascode node 424 and the reference bitline (BLRF) node 128. The PMOS transistor P405 includes drain-source terminals coupled between the power signal line 420 and the gate of the NMOS transistor N403, and includes a gate coupled to the gate of the NMOS transistor N403. The NMOS transistor N404 includes drain-source terminals coupled between the gate of the PMOS transistor P405 and ground, and includes a gate coupled to the reference bitline (BLRF) node 128.

The PMOS transistors P404, P408 and the NMOS transistor N409 form a selectable load on the cascode reference (CASREF) node 424. In one embodiment, the capacitance of the bitline 126 and the reference bit line 128 are substantially equal, and the voltage on the reference bit line 128 is a voltage between the typical logic level voltages of the bit line 126. The additional selectable loading selectively adjusts for this difference. The delayed address transition (ATBdelay) signal 124 enables or disables the load formed by the PMOS transistors P404, P408 and the NMOS transistor N409. Specifically, the PMOS transistor P404 includes a drain terminal coupled to the power supply line 420, and includes a gate terminal coupled to a source terminal of the PMOS transistor P404. The PMOS transistor P408 includes a drain terminal coupled to the source terminal of the PMOS transistor P404 and a gate terminal having the delayed address transition (ATBdelay) signal 124 applied thereto. The NMOS transistor N409 includes drain-source terminals coupled between the source of the PMOS transistor P408 and the reference bitline (BLRF) node 128, and includes a gate coupled to the common node formed of the gate of the NMOS transistor N403 and the drain of the NMOS transistor N409. The NMOS transistor N408 provides additional loading in the comparator 406 to compensate for the loading of the PMOS transistor P404 in the reference sense circuit 404.

In one embodiment, the NMOS transistors N401, N403, N404 have substantially identical electrical characteristics. With such characteristics, the NMOS transistors N401, N403, N404 provide substantially identical pull-up loading on the cascode node 422 and the reference cascode node 424.

The comparator 406 comprises NMOS transistors N405, N406, N407, N408 and PMOS transistors P406, P407. The comparator 406 is arranged as a differential amplifier. The PMOS transistor P406 includes a drain terminal coupled to the power signal line 420, includes a source terminal coupled to the output terminal 130, and includes a gate coupled to the source terminal of the PMOS transistor P406. The NMOS transistor N405 includes drain-source terminals coupled between the common node formed of the gate and source terminal of the PMOS transistor P406 and a bias node 426, and includes a gate coupled to the reference cascode (CASREF) node 424. The PMOS transistor P407 includes a drain terminal coupled to the power signal line 420, and includes a gate coupled to the gate of the PMOS transistor P406. The NMOS transistor N406 includes drain-source terminals coupled between the source of the PMOS transistor P407 and the bias node 426, and includes a gate coupled to a cascode (CASO) node 422. The NMOS transistor N407 includes drain-source terminals coupled between the bias node 426 and ground, and includes a gate coupled to receive a bias signal 428. The NMOS transistor N408 includes drain-source terminals coupled between the power signal line 420 and the bias node 226, and includes a gate coupled to the cascode (CASO) node 422.

Figure 5:
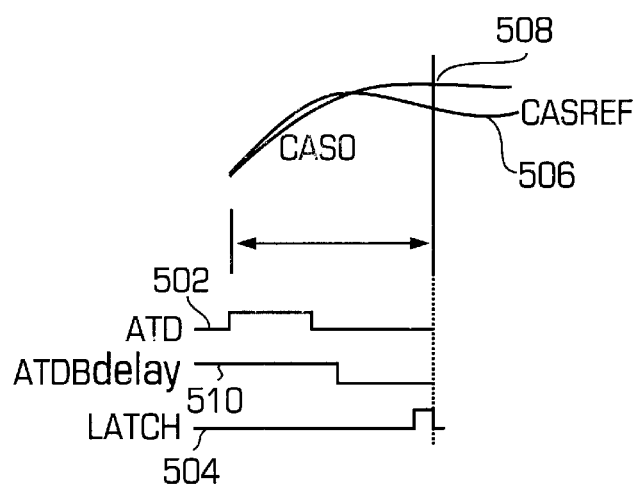
FIG. 5 is a timing diagram illustrating the timing waveforms of the sense circuit of FIG. 4.

FIG. 5 is a timing diagram illustrating the timing waveforms of the bitline precharging circuit of FIG. 4. Line 502 represents the timing of the address transition detection signal 122 from the address transition detector 114 that indicates a transition of an address. At this time the bit line 126 and the reference bit line 128 are precharged. After these lines are precharged, the data is read from the corresponding memory cell and then latched into the latch 110 by the latch signal 132. Line 504 representing the timing of the latch signal 132. Line 506 represents the timing diagram of the reference cascode (CASREF) node 424. Line 508 represents the timing diagram of the cascode (CASREF) node 422. Line 510 represents the timing diagram of the delayed address transition (ATBdelay) signal 124.

After the address transition signal 122 is set, the cascode (CASO) node 422 and the cascode references (CASREF) node 424 are precharged before reading of the corresponding memory cell and reference cell. The delayed address transition (ATBdelay) signal 124 is also set, so that the PMOS transistor P408 disconnects the pull-up from the PMOS transistor P404. In this mode, the pull-up of the sense amplifier 402 and the reference sense circuit 404 are substantially identical, so that the voltage of the cascode (CASO) node 422 and the cascode reference (CASREF) node 424 as indicated by lines 508 and 506, respectively, are substantially identical. The delayed address transition (ATBdelay) signal 124 is disabled to thereby turn on the PMOS transistor P408 and provide additional pull-up loading on the cascode reference (CASREF) node 224. The latch signal 132 shown in line 504 latches the data read from the comparator 406 into the latch 110.

Although a sense circuit is described using NMOS and PMOS transistors, a sense circuit could be made using other types of transistors such as bipolar junction transistors.

In this disclosure, there is shown and described only the preferred embodiments of the invention, but, as aforementioned, it is to be understood that the invention is capable of use in various other combinations and environments and is capable of changes or modifications within the scope of the inventive concept as expressed herein.

What is claimed is:

1. A sense amplifier circuit comprising:
   a sense amplifier providing a sense signal in response to a voltage level on a bit line;
   a reference sense circuit providing a reference sense signal in response to a voltage on a reference column line, the reference sense circuit providing variable loading on the reference column line in response to a delay signal; and
   a comparator for providing a signal indicative of the signal on the bit line in response to the sense signal and the reference sense signal.

2. The sense amplifier of claim 1 wherein the sense amplifier comprises:
   a first transistor of a first type having a first terminal coupled to a power terminal and having a second terminal coupled to a first reference node and spaced apart from the first terminal with a channel therebetween, and having a gate coupled to the first reference node for controlling the flow of current in said channel;
   a first transistor of a second type having a first terminal coupled to the first reference node, having a second terminal coupled to a bit line terminal and spaced apart from the first terminal with a channel therebetween, and having a gate for controlling the flow of current in said channel;
   a second transistor of the first type having a first terminal coupled to the power terminal, having a second terminal coupled to the gate of the first transistor of the second type and spaced apart from the first terminal with a channel therebetween, and having a gate coupled to the second terminal of the second transistor of the first type for controlling the flow of current in said channel;

a second transistor of the second type having a first terminal coupled to the second terminal of the second transistor of the first type, having a second terminal coupled to a ground terminal and spaced apart from the first terminal with a channel therebetween, and having a gate coupled to the bit line terminal for controlling the flow of current in said channel;

the reference sense circuit comprises:

a third transistor of the first type having a first terminal coupled to the power terminal and having a second terminal coupled to a second reference node and spaced apart from the first terminal with a channel therebetween, and having a gate coupled to the second reference node for controlling the flow of current in said channel;

a third transistor of the second type having a first terminal coupled to the second reference node, having a second terminal coupled to a reference column line terminal and spaced apart from the first terminal with a channel therebetween, and having a gate for controlling the flow of current in said channel;

a fourth transistor of the first type having a first terminal coupled to the power terminal and having a second terminal coupled to the gate of the third transistor of the second type and spaced apart from the first terminal with a channel therebetween, and having a gate coupled to the second terminal of the fourth transistor of the first type for controlling the flow of current in said channel;

a fourth transistor of the second type having a first terminal coupled to the second terminal of the fourth transistor of the first type, having a second terminal coupled to a ground terminal and spaced apart from the first terminal with a channel therebetween, and having a gate coupled to the reference bit line terminal for controlling the flow of current in said channel;

a fifth transistor of the first type having a first terminal coupled to the power terminal, having a second terminal spaced apart from the first terminal with a channel therebetween, and having a gate coupled to the second terminal of the fifth transistor of the first type for controlling the flow of current in said channel;

a sixth transistor of the first type having a first terminal coupled to the second terminal of the fifth transistor of the first type, having a second terminal spaced apart from the first terminal with a channel therebetween, and having a gate for controlling the flow of current in said channel and receiving a delay signal; and a fifth transistor of the second type having a first terminal coupled to the second terminal of the sixth transistor of the first type, having a second terminal coupled to the common node of the second terminal of the third transistor of the second type, the gate of the fourth transistor of the second type, and the reference column line terminal and spaced apart from the first terminal with a channel therebetween, and having a gate coupled to the gate of the third transistor of the second type for controlling the flow of current in said channel.

3. The sense amplifier circuit of claim 2, wherein the comparator comprises:

a seventh transistor of the first type having a first terminal coupled to the power terminal, having a second terminal spaced apart from the first terminal with a channel therebetween, and having a gate coupled to the second terminal of the seventh transistor of the first type for controlling the flow of current in said channel;

a sixth transistor of the second type having a first terminal coupled to the second terminal of the seventh transistor of the first type, having a second terminal spaced apart from the first terminal with a channel therebetween, and having a gate coupled to the second reference node for controlling the flow of current in said channel;

an eighth transistor of the first type having a first terminal coupled to the power terminal, having a second terminal spaced apart from the first terminal with a channel therebetween, and having a gate coupled to a common node formed of the gate and second terminal of the seventh transistor of the first type and the first terminal of the sixth transistor of the second type for controlling the flow of current in said channel;

a seventh transistor of the second type having a first terminal coupled to the second terminal of the eighth transistor of the first type, having a second terminal coupled to the second terminal of the sixth transistor of the second type and spaced apart from the first terminal with a channel therebetween, and having a gate coupled to the first reference node for controlling the flow of current in said channel; and an eighth transistor of the second type having a first terminal coupled to a common node formed of the second terminals of the sixth and second transistors of the second type, having a second terminal coupled to the ground terminal and spaced apart from the first terminal with a channel therebetween, and having a gate coupled to a bias signal terminal for controlling the flow of current in said channel.

4. The sense amplifier circuit of claim 2 wherein electrical characteristics of the first transistor of the second type is similar to electrical characteristics of the third transistor of the second type.

5. The sense amplifier circuit of claim 2 wherein electrical characteristics of the first transistor of the second type are similar to electrical characteristics of the fifth transistor of the second type.

6. The sense amplifier circuit of claim 2 wherein electrical characteristics of the first transistor of the second type are similar to electrical characteristics of the third transistor of the second type and are similar to electrical characteristics of the fifth transistor of the second type.

7. The sense amplifier circuit of claim 1 wherein the delay signal is applied in response to a detected address transition.

8. The sense amplifier circuit of claim 7 wherein the delay signal has a pulse width sufficient to allow precharge signals applied to the column line and the reference bit line to achieve a near steady state condition.

9. A sense amplifier circuit comprising:

a first transistor of a first type having a first terminal coupled to a power terminal and having a second terminal coupled to a first reference node and spaced apart from the first terminal with a channel therebetween, and having a gate coupled to the first reference node for controlling the flow of current in said channel;

a first transistor of a second type having a first terminal coupled to the first reference node, having a second terminal coupled to a bit line terminal and spaced apart from the first terminal with a channel therebetween, and having a gate for controlling the flow of current in said channel;

a second transistor of the first type having a first terminal coupled to the power terminal, having a second terminal coupled to the gate of the first transistor of the second type and spaced apart from the first terminal with a channel therebetween, and having a gate coupled to the second terminal of the second transistor of the first type for controlling the flow of current in said channel;

a second transistor of the second type having a first terminal coupled to the second terminal of the second transistor of the first type, having a second terminal coupled to a ground terminal and spaced apart from the first terminal with a channel therebetween, and having a gate coupled to the bit line terminal for controlling the flow of current in said channel;

a third transistor of the first type having a first terminal coupled to the power terminal and having a second terminal coupled to a second reference node and spaced apart from the first terminal with a channel therebetween, and having a gate coupled to the second reference node for controlling the flow of current in said channel;

a third transistor of the second type having a first terminal coupled to the second reference node, having a second terminal coupled to a reference bit line terminal and spaced apart from the first terminal with a channel therebetween, and having a gate for controlling the flow of current in said channel;

a fourth transistor of the first type having a first terminal coupled to the power terminal and having a second terminal coupled to the gate of the third transistor of the second type and spaced apart from the first terminal with a channel therebetween, and having a gate coupled to the second terminal of the fourth transistor of the first type for controlling the flow of current in said channel;

a fourth transistor of the second type having a first terminal coupled to the second terminal of the fourth transistor of the first type, having a second terminal coupled to a ground terminal and spaced apart from the first terminal with a channel therebetween, and having a gate coupled to the reference bit line terminal for controlling the flow of current in said channel;

a fifth transistor of the first type having a first terminal coupled to the power terminal, having a second terminal spaced apart from the first terminal with a channel therebetween, and having a gate coupled to the second terminal of the fifth transistor of the first type for controlling the flow of current in said channel;

a sixth transistor of the first type having a first terminal coupled to the second terminal of the fifth transistor of the first type, having a second terminal spaced apart from the first terminal with a channel therebetween, and having a gate for controlling the flow of current in said channel and receiving a delay signal;

a fifth transistor of the second type having a first terminal coupled to the second terminal of the sixth transistor of the first type, having a second terminal coupled to the common node of the second terminal of the third transistor of the second type, the gate of the fourth transistor of the second type, and the reference bit line terminal and spaced apart from the first terminal with a channel therebetween, and having a gate coupled to the gate of the third transistor of the second type for controlling the flow of current in said channel;

a seventh transistor of the first type having a first terminal coupled to the power terminal, having a second terminal spaced apart from the first terminal with a channel therebetween, and having a gate coupled to the second terminal of the seventh transistor of the first type for controlling the flow of current in said channel;

a sixth transistor of the second type having a first terminal coupled to the second terminal of the seventh transistor of the first type, having a second terminal spaced apart from the first terminal with a channel therebetween, and having a gate coupled to the second reference node for controlling the flow of current in said channel;

an eighth transistor of the first type having a first terminal coupled to the power terminal, having a second terminal spaced apart from the first terminal with a channel therebetween, and having a gate coupled to the common node formed of the gate and second terminal of the seventh transistor of the first type and the first terminal of the sixth transistor of the second type for controlling the flow of current in said channel;

a seventh transistor of the second type having a first terminal coupled to the second terminal of the eighth transistor of the first type, having a second terminal coupled to the second terminal of the sixth transistor of the second type and spaced apart from the first terminal with a channel therebetween, and having a gate coupled to the first reference node for controlling the flow of current in said channel; and an eighth transistor of the second type having a first terminal coupled to a common node formed of the second terminals of the sixth and second transistors of the second type, having a second terminal coupled to the ground terminal and spaced apart from the first terminal with a channel therebetween, and having a gate coupled to a bias signal terminal for controlling the flow of current in said channel.

10. The sense amplifier circuit of claim 9 comprising:

a ninth transistor of the second type having a first terminal coupled to the power terminal, having a second terminal coupled to the common node formed of the second terminals of the sixth and second transistors of the second type and spaced apart from the first terminal with a channel therebetween, and having a gate coupled to the first reference node for controlling the flow of current in said channel.

11. The sense amplifier circuit of claim 9 wherein electrical characteristics of the first transistor of the second type are similar to electrical characteristics of the third transistor of the second type.

12. The sense amplifier circuit of claim 9 wherein electrical characteristics of the first transistor of the second type are similar to electrical characteristics of the fifth transistor of the second type.

13. The sense amplifier circuit of claim 9 wherein electrical characteristics of the first transistor of the second type are similar to electrical characteristics of the third transistor of the second type and are similar to electrical characteristics of the fifth transistor of the second type.

14. The sense amplifier circuit of claim 9 wherein the delay signal is applied in response to a detected address transition.

15. The sense amplifier circuit of claim 14 wherein the delay signal has a pulse width sufficient to allow precharge signals applied to the bit line and the reference bit line to achieve a near steady state condition.

16. A memory circuit comprising:

an array of memory cells arranged in rows and columns and including a column of reference cells, a plurality of bit lines, and a reference bit line, each of the plurality of bit lines connecting a corresponding column of memory cells, the reference bit line connecting the column of reference cells;

a decoder coupled to the rows of memory cells for selecting a row of memory cells and a corresponding reference cell in response to an address signal;

an address detection circuit providing an address detection signal and a delay signal in response to a change of the address signal;

a precharge circuit coupled to the address detection circuit and the memory array for precharging the plurality of bit lines and the reference bit line in response to the address detection signal; and a sense amplifier circuit comprising:
  a sense amplifier providing a sense signal in response to a voltage level on a selected one of the plurality of bit lines;
  a reference sense circuit providing a reference sense signal in response to a voltage on the reference bit line, the reference sense circuit providing variable loading on the reference bit line in response to a delay signal; and
  a comparator for providing a signal indicative of the signal on the selected bit line in response to the sense signal and the reference sense signal.

17. The memory circuit of claim 16 wherein the sense amplifier comprises:
  a first transistor of a first type having a first terminal coupled to a power terminal and having a second terminal coupled to a first reference node and spaced apart from the first terminal with a channel therebetween, and having a gate coupled to the first reference node for controlling the flow of current in said channel;
  a first transistor of a second type having a first terminal coupled to the first reference node, having a second terminal coupled to a bit line terminal and spaced apart from the first terminal with a channel therebetween, and having a gate for controlling the flow of current in said channel;
  a second transistor of the first type having a first terminal coupled to the power terminal, having a second terminal coupled to the gate of the first transistor of the second type and spaced apart from the first terminal with a channel therebetween, and having a gate coupled to the second terminal of the second transistor of the first type for controlling the flow of current in said channel;
  a second transistor of the second type having a first terminal coupled to the second terminal of the second transistor of the first type, having a second terminal coupled to a ground terminal and spaced apart from the first terminal with a channel therebetween, and having a gate coupled to the bit line terminal for controlling the flow of current in said channel;

the reference sense circuit comprises:
  a third transistor of the first type having a first terminal coupled to the power terminal and having a second terminal coupled to a second reference node and spaced apart from the first terminal with a channel therebetween, and having a gate coupled to the second reference node for controlling the flow of current in said channel;
  a third transistor of the second type having a first terminal coupled to the second reference node, having a second terminal coupled to a reference bit line terminal and spaced apart from the first terminal with a channel therebetween, and having a gate for controlling the flow of current in said channel;
  a fourth transistor of the first type having a first terminal coupled to the power terminal and having a second terminal coupled to the gate of the third transistor of the second type and spaced apart from the first terminal with a channel therebetween, and having a gate coupled to the second terminal of the fourth transistor of the first type for controlling the flow of current in said channel;
  a fourth transistor of the second type having a first terminal coupled to the second terminal of the fourth transistor of the first type, having a second terminal coupled to a ground terminal and spaced apart from the first terminal with a channel therebetween, and having a gate coupled to the reference bit line terminal for controlling the flow of current in said channel;
  a fifth transistor of the first type having a first terminal coupled to the power terminal, having a second terminal spaced apart from the first terminal with a channel therebetween, and having a gate coupled to the second terminal of the fifth transistor of the first type for controlling the flow of current in said channel;
  a sixth transistor of the first type having a first terminal coupled to the second terminal of the fifth transistor of the first type, having a second terminal spaced apart from the first terminal with a channel therebetween, and having a gate for controlling the flow of current in said channel and receiving a delay signal; and
  a fifth transistor of the second type having a first terminal coupled to the second terminal of the sixth transistor of the first type, having a second terminal coupled to the common node of the second terminal of the third transistor of the second type, the gate of the fourth transistor of the second type, and the reference bit line terminal and spaced apart from the first terminal with a channel therebetween, and having a gate coupled to the gate of the third transistor of the second type for controlling the flow of current in said channel.

18. The memory circuit of claim 17, wherein the comparator comprises:
  a seventh transistor of the first type having a first terminal coupled to the power terminal, having a second terminal spaced apart from the first terminal with a channel therebetween, and having a gate coupled to the second terminal of the seventh transistor of the first type for controlling the flow of current in said channel;
  a sixth transistor of the second type having a first terminal coupled to the second terminal of the seventh transistor of the first type, having a second terminal spaced apart from the first terminal with a channel therebetween, and having a gate coupled to the second reference node for controlling the flow of current in said channel;
  an eighth transistor of the first type having a first terminal coupled to the power terminal, having a second terminal spaced apart from the first terminal with a channel therebetween, and having a gate coupled to a common node formed of the gate and second terminal of the seventh transistor of the first type and the first terminal of the sixth transistor of the second type for controlling the flow of current in said channel;

a seventh transistor of the second type having a first terminal coupled to the second terminal of the eighth transistor of the first type, having a second terminal coupled to the second terminal of the sixth transistor of the second type and spaced apart from the first terminal with a channel therebetween, and having a gate coupled to the first reference node for controlling the flow of current in said channel; and an eighth transistor of the second type having a first terminal coupled to a common node formed of the second terminals of the sixth and second transistors of the second type, having a second terminal coupled to the ground terminal and spaced apart from the first terminal with a channel therebetween, and having a gate coupled to a bias signal terminal for controlling the flow of current in said channel.

19. The memory amplifier circuit of claim 17 wherein electrical characteristics of the first transistor of the second type are similar to electrical characteristics of the third transistor of the second type.

20. The memory circuit of claim 17 wherein electrical characteristics of the first transistor of the second type are similar to electrical characteristics of the fifth transistor of the second type.

21. The memory circuit of claim 17 wherein electrical characteristics of the first transistor of the second type are similar to electrical characteristics of the third transistor of the second type and are similar to electrical characteristics of the fifth transistor of the second type.

22. The memory circuit of claim 17 wherein the delay signal is applied in response to a detected address transition.

23. The memory circuit of claim 22 wherein the delay signal has a pulse width sufficient to allow precharge signals applied to the bit line and the reference column line to achieve a near steady state condition.

24. The memory circuit of claim 16 wherein the delay signal is applied in response to a detected address transition.

25. The memory circuit of claim 24 wherein the delay signal has a pulse width sufficient to allow precharge signals applied to the bit line and the reference column line to achieve a near steady state condition.

\* \* \* \* \*